United States Patent
Kampfer

(10) Patent No.: US 9,910,080 B2
(45) Date of Patent: Mar. 6, 2018

(54) METHOD AND ARRANGEMENT FOR LOCATING SHORT-CIRCUITS IN ENERGY SUPPLY SYSTEMS

(71) Applicant: ABB Technology AG, Zurich (CH)

(72) Inventor: Stefan Kampfer, Mannheim (DE)

(73) Assignee: ABB Schweiz AG, Baden (CH)

( * ) Notice: Subject to any disclaimer, the term of this patent is extended or adjusted under 35 U.S.C. 154(b) by 183 days.

(21) Appl. No.: 14/700,781

(22) Filed: Apr. 30, 2015

(65) Prior Publication Data

US 2015/0234016 A1    Aug. 20, 2015

Related U.S. Application Data

(63) Continuation of application No. PCT/EP2013/072162, filed on Oct. 23, 2013.

(30) Foreign Application Priority Data

Oct. 31, 2012    (DE) .................. 10 2012 021 330
Apr. 11, 2013    (DE) .................. 10 2013 006 199

(51) Int. Cl.
   *G01R 31/08*    (2006.01)
   *G01R 31/40*    (2014.01)
   *G01R 15/18*    (2006.01)

(52) U.S. Cl.
   CPC ............. *G01R 31/08* (2013.01); *G01R 15/18* (2013.01); *G01R 31/40* (2013.01)

(58) Field of Classification Search
   CPC ..... G01R 31/08; G01R 31/085; G01R 31/086
   USPC ........................................................ 324/522
   See application file for complete search history.

(56) References Cited

U.S. PATENT DOCUMENTS

| 3,876,886 A * | 4/1975 | McClain ................ H02H 3/003 |
| | | 307/51 |
| 5,572,138 A | 11/1996 | Nimmersjo |
| 6,940,702 B2 * | 9/2005 | Kojovic |
| 2009/0289637 A1 | 11/2009 | Radtke |
| 2010/0007354 A1 | 1/2010 | Deaver, Sr. et al. |
| 2012/0265463 A1 | 10/2012 | Von Sengbusch |

FOREIGN PATENT DOCUMENTS

| DE | 197 32 103 A1 | 8/1998 |
| DE | 10 2009 048 509 A1 | 4/2011 |
| WO | WO 95/19060 A1 | 7/1995 |
| WO | WO 2014/005619 A1 | 1/2014 |

OTHER PUBLICATIONS

International Search Report (PCT/ISA/210) dated Feb. 12, 2014 by the European Patent Office as the International Searching Authority for International Application No. PCT/EP2013/072162.

* cited by examiner

*Primary Examiner* — Walter L Lindsay, Jr.
*Assistant Examiner* — Milton Gonzalez
(74) *Attorney, Agent, or Firm* — Barnes & Thornburg LLP

(57) ABSTRACT

A method and an arrangement are disclosed for determining the direction of excess currents in energy supply networks, such as in medium voltage networks. An exemplary method and arrangement render it possible to reliably isolate a point of fault caused by a short-circuit or excess current, even if switching systems of the energy supply network do not include a capacitive pickup. Exemplary arrangements include an energy supply network which connects, via a transformer, a medium voltage network to a low voltage network.

18 Claims, 1 Drawing Sheet

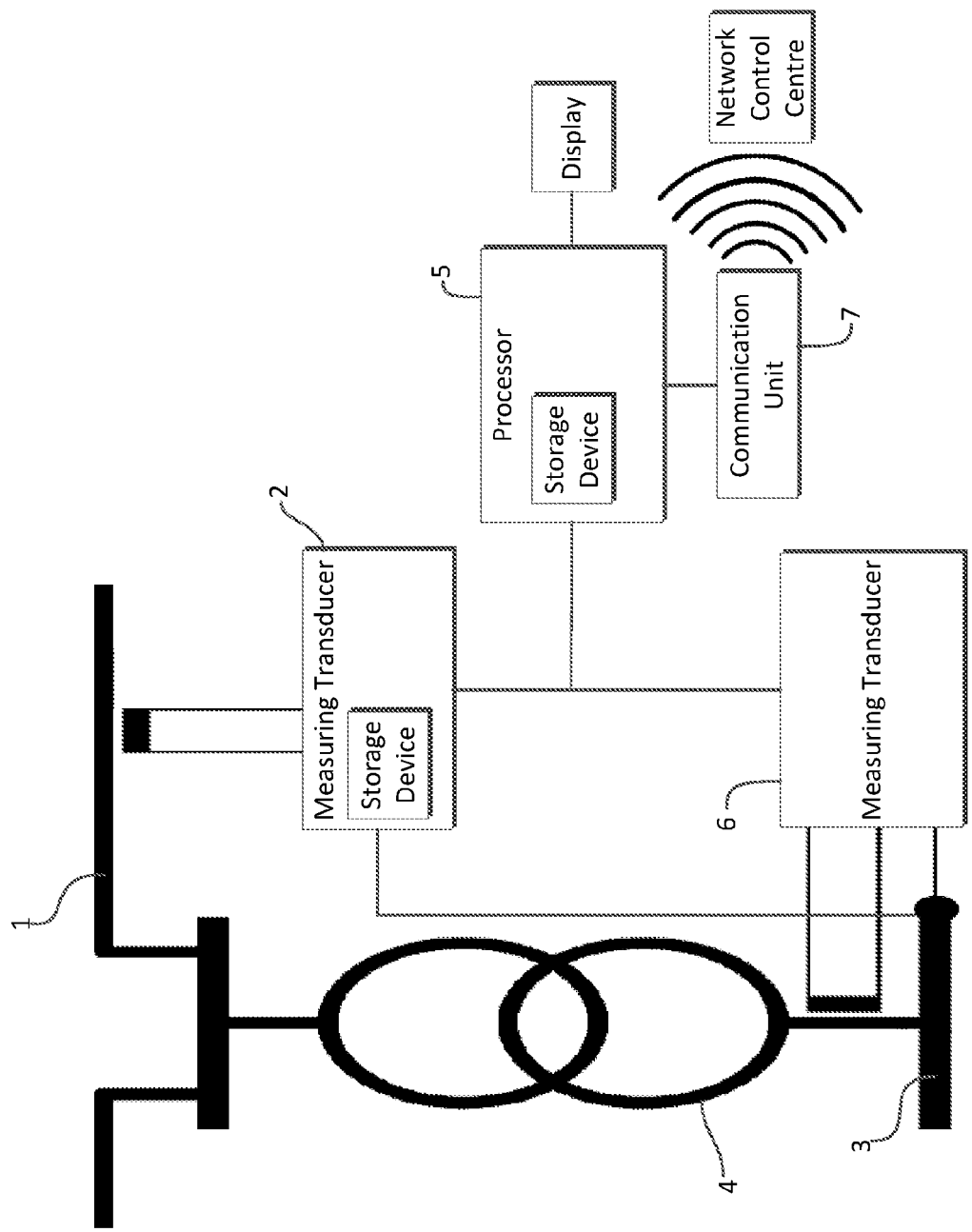

METHOD AND ARRANGEMENT FOR LOCATING SHORT-CIRCUITS IN ENERGY SUPPLY SYSTEMS

RELATED APPLICATION

This application claims priority as a continuation application under 35 U.S.C. §120 to PCT/EP2013/072162, which was filed as an International Application on Oct. 23, 2013, designating the U.S., and which claims priority to German Application 10 2012 021 330.1 filed in Germany on Oct. 31, 2012 and to German Application 10 2013 006 199.7 filed in Germany on Apr. 11, 2013. The entire contents of these applications are hereby incorporated by reference in their entireties.

FIELD

The present disclosure relates to a method and an arrangement for determining a direction of excess currents in energy supply networks, such as in medium voltage networks.

BACKGROUND INFORMATION

In electrical supply networks, also described as electrical distribution networks, local network stations, or transformer substations, are used to transform and distribute electrical current. The local network stations or transformer substations that connect a medium voltage level and a low voltage level of a current network to one another can be constructed from a medium voltage switching system, a transformer and a low voltage distribution system. In order to locate short-circuits in the medium voltage network, short-circuit indicators are installed in the local network stations and the short-circuit indicators indicate any occurrence of an excess current.

A clearly directed load flow and radially operated networks led previously to a clear direction of the short-circuits in the energy supply networks so that a point of fault could be isolated using the short-circuit indicators. If medium voltage networks are operated in closed rings or rather as an intermeshed network (in other words, in this network, each network node is connected to one or more other network nodes), it is possible for occurring short-circuits to be supplied from different directions.

Furthermore, decentralized systems can lead to altered load flows and can likewise contribute to the excess current. In both cases, a mere identification of an excess current does not suffice for clearly isolating a point of fault. The network section that has the point of fault can however only be clearly located as a result of adding the direction information of the short-circuit or excess current. For this purpose, more recent short-circuit indicators use the capacitive pickup of the medium voltage switching unit that is provided in the proper sense only to establish an absence of voltage for a voltage measurement with a reduced measurement quality. If a capacitive pickup is not present, for example in air-insulated systems, it is not possible to identify the direction of the short-circuit or excess current.

SUMMARY

A method is disclosed for determining a direction of an excess current in an energy supply network having at least one local network station or transformer substation that connects a medium voltage level of a medium voltage network and a low voltage level of a low voltage network to one another by way of a transformer, the method comprising: measuring a current measurement with a first measuring transducer in at least one output line of the medium voltage network and measuring a voltage measurement in a low voltage level of the transformer or a subordinate low voltage distribution system to detect an excess current; measuring a phase difference between the current that is measured in the medium voltage level and the voltage that is measured in the low voltage level, or determining a power flow in the medium voltage network from the current and voltage measurements; evaluating the phase difference or the power flow in the medium voltage network by the first measuring transducer or a processing unit that cooperates with the transducer, taking into account a phase rotation of the transformer; and determining a direction of an excess current from the phase difference or power flow.

An arrangement is also disclosed for determining a direction of excess current in an energy supply network having at least one local network station or transformer substation that connects a medium voltage level and a low voltage level to one another by way of a transformer, the arrangement comprising: a first measuring transducer for making a current measurement in at least one output line of a medium voltage level and for making a voltage measurement on a low voltage level of a transformer to detect an excess current; and a processing unit within, or cooperating with, said measuring transducer and configured for determining from the current measurement and voltage measurement a phase difference between current that is measured in the medium voltage level and voltage that is measured in the low voltage level, or a power flow in the medium voltage level, the processor being configured to take into account a phase rotation of the transformer, to evaluate the phase difference or the power flow and determine a direction of an excess current.

BRIEF DESCRIPTION OF THE DRAWINGS

Features and advantages disclosed herein will be further described with reference to the exemplary embodiments of an arrangement illustrated in the FIGURE, wherein:

FIG. 1 illustrates schematically a part region of an exemplary energy supply network that can include decentralized energy systems, the exemplary energy supply network having a medium voltage level and a network voltage level.

DETAILED DESCRIPTION

A method and an arrangement are disclosed for determining the direction of excess currents in energy supply networks, such as in medium voltage networks. An exemplary method and arrangement render it possible to reliably isolate a point of fault caused by a short-circuit or excess current, even if the switching systems of the energy supply network do not include a capacitive pickup.

In accordance with exemplary embodiments, a method is provided for determining the direction of excess currents in an energy supply network that connects by way of a transformer a medium voltage network to a low voltage network, also known as a medium voltage level and a low voltage level, wherein the transformer that is arranged between the medium voltage level and the low voltage level transforms the medium voltage into a low voltage.

An exemplary method as disclosed herein can include multiple features.

For example, in a first step, a current measurement is performed in at least one output line of the medium voltage level by means of a first measuring transducer and also a voltage measurement is performed in the low voltage level of the transformer or in a low voltage distribution system that is arranged downstream and an excess current is detected. By way of example, current converters or current sensors are used to measure the current. The voltage measurement can be performed in an advantageous manner in the low voltage level by means of directly recording the voltage in a measuring transducer or a processing unit. A voltage converter or voltage sensor is not required.

In a second exemplary step, a phase difference between the current that is measured in the medium voltage level 1 and the voltage that is measured in the low voltage level 3 is determined from the current measurement and voltage measurement.

The phase difference between the current that is measured in the medium voltage level and the voltage that is measured in the low voltage level is evaluated in the first measuring transducer or in a processing unit that cooperates with the measuring transducer, by way of example a remotely located unit, to the effect that the direction of the excess current is determined from the phase position and the determined decision regarding the direction is corrected in dependence upon a phase rotation of the transformer. Depending on the reference system, the fault can be located upstream or downstream of the measuring position. This direction can be determined with reference to the value of the phase difference.

In order to determine the direction of the excess current in a more precise manner, it is possible in an exemplary embodiment to set a correcting phase angle in the first measuring transducer or the processing unit, and the correcting phase angle takes into account the line phase angle. The line phase angle takes into account the phase rotation of the current that is caused as a result of line impedance.

In an exemplary embodiment and method in accordance with the present disclosure, a second measuring transducer is arranged on the low voltage level of the transformer and an additional current measurement and voltage measurement is performed at the low voltage level using the second measuring transducer, wherein from the additional measurement a power flow through the transformer and thus a load-dependent voltage difference is determined from the magnitude of the power flow and the phase angle. This is performed by using a transformer equivalent circuit diagram or transformer model that is implemented in a processing unit. The phase difference between the medium voltage current and the voltage in the low voltage level can be additionally corrected using the determined phase angle which is in particular relevant even if in the case of a short-circuit a load flow occurs through the transformer, by way of example by means of energy systems that are arranged in a decentralised manner in the supply network, and this results in an angle of phase rotation that cannot be ignored.

In an alternative to using the phase difference between the measured current and the measured voltage, the power flow and thus the power flow direction in the medium voltage network can also be determined using the above described method. A decision on the direction relating to the direction of the excess current can likewise be determined on the basis of the power flow direction, wherein the fault is located in the supply direction of the power.

In an exemplary embodiment of a method in accordance with the present disclosure, an extrapolation of the voltage is performed upstream of where the short circuit occurs or rather where the excess current occurs in a storage device, which is integrated into the measuring transducer, or in the processing unit and the direction of the current is determined from the extrapolation on the basis of these stored values, whereby the reliability of determining the direction is increased in an advantageous manner in the case of very small voltage values.

In accordance with a further aspect disclosed herein, an exemplary arrangement is provided for determining the direction of excess currents in an energy supply network having at least one local network station or rather transformer substation that connects a medium voltage level and a low voltage level to one another by way of a transformer.

An exemplary arrangement in accordance with the present disclosure is equipped with a first measuring transducer in which an excess current is identified and the direction of the current is determined in the medium voltage level.

The first measuring transducer is arranged in at least one output line of the medium voltage level and performs a current measurement on the medium voltage level and also a voltage measurement on the lower voltage level of the transformer and detects from these measurements a pending excess current.

The first measuring transducer or a processing unit that cooperates with the first measuring transducer determines from the current measurement and the voltage measurement the phase difference between the current and voltage or determines a power flow in the medium voltage level and evaluates the phase difference or the power flow taking into account the phase rotation of the transformer and from the evaluation determines the direction of the excess current.

In accordance with an exemplary embodiment of an arrangement in accordance with the present disclosure, a second measuring transducer is provided that cooperates with the first measuring transducer and performs an additional current measurement and voltage measurement on the low voltage level of the transformer. It is then possible using this measurement to determine a power flow through the transformer and thus a load-dependent voltage difference from the magnitude of the power flow and the phase angle.

The current measurements of the measuring transducer are for example embodied as current converters or current sensors.

In accordance with exemplary embodiments, the first measuring transducer and/or the second measuring transducer are connected in order to isolate a point of fault in the energy supply network by remote diagnosis by way of a communication unit having a network control centre or a higher ranking system that is by way of example embodied as a management/control system that receives for further processing the measured values or notifications regarding the direction of the excess current that are provided by the measuring transducer or by the processing unit of the local network station or transformer substation. By way of example, a control system can thus automatically isolate the point of fault by using a stored network topology on the basis of the notifications received from multiple local network stations or rather transformer substations, the control system can subsequently propose switching operations for clearing affected network parts and a resupply of non-affected network parts or the control system can automatically perform the procedures.

The communication unit is for example housed in a separate device but can also be integrated into the processing unit.

In an exemplary embodiment of an arrangement in accordance with the present disclosure for locating short-circuits in the medium voltage level of the energy supply network, the local network station or transformer substation is equipped with a display apparatus that displays the data or notifications regarding the direction of the excess current that are obtained from the measured values and, by way of example can dispatch a fault clearance team to the transformer substation.

With reference to FIG. 1, a schematically illustrated part region of an energy supply network that can also include decentralized energy systems is shown, wherein the energy supply system includes a medium voltage level 1 and a network voltage level 3.

The medium voltage network is transformed by way of a transformer substation that can include a transformer 4 that is illustrated in this FIGURE as a main component, and the transformer transforms the higher voltages of the medium voltage level 1 to lower voltages of the low voltage level 3.

The transformer substation between the medium voltage level 1 and the low voltage level 3 can also be described as a local network station since it is arranged near to households in built-up areas and provides a network voltage for end consumers.

The current is measured in an output line of the medium voltage level 1 by means of a first measuring transducer 2 and an excess current is detected. Simultaneously, the first measuring transducer 2 performs a voltage measurement on the low voltage level 3 of the transformer 4 or in a subordinate low voltage distribution system. The phase difference between measured current and measured voltage is determined by way of the two measurements. The phase difference is evaluated within the first measuring transducer 2 or in a further-processing unit 5 (e.g., any known processor and associated memory with a stored computer program that will configure the computer hardware to perform the funtionality disclosed herein) where the processor is within or connected to the first measuring transducer 2, by way of example in a remotely located control unit; the processor can be arranged and configured to take into account the phase rotation of the transformer 4, and the direction of excess current is determined as a result of the evaluation.

In order to improve the process of determining the current direction, the correcting phase angle that by way of example takes into account the line phase angle can moreover not only be set in the first measuring transducer 2 but it can also be set in the further-processing unit 5 in order to improve the process of determining the direction.

An exemplary arrangement in accordance with the present disclosure can optionally include a second measuring transducer 6 that is arranged on the low voltage level 3 of the transformer 4 and that cooperates with the first measuring transducer 2 and the associated processing unit 5 in order to provide an additional current and voltage measurement.

In accordance with exemplary embodiments, the load-dependent voltage phase angle difference by way of the transformer 4 is taken into account during the process of determining the direction by measuring the current and voltage on the low voltage level 3. The measurement is performed by way of the second measuring transducer 6 and the determined direction is corrected by the computer program executed within the further-processing unit 5.

The current direction is determined by the power direction at the transformer 4. The power is determined from the current and voltage measurements of the low voltage level 3 and the current measurement on the medium voltage level 1 taking into account the characteristic data of the transformer 4 in the further-processing unit 5.

The second measuring transducer 6 determines the power flow through the transformer 4 and thus the load-dependent voltage difference that arises from a magnitude of the power flow and the phase angle. The values of the additional current measurement and voltage measurement are supplied by means of the second measuring transducer 6 of the further-processing unit 5 in order to determine the load-dependent voltage difference, and a transformer equivalent circuit diagram or transformer model are implemented in the further-processing unit.

The phase difference between the current that flows in the medium voltage level 1 and the voltage in the low voltage level 3 can be additionally corrected using the determined phase angle. This is particularly relevant even if in the case of a short-circuit, a load flow occurs through the transformer 4, by way of example caused as a result of decentralized energy systems, and this results in an angle of phase rotation of the phase difference that cannot be ignored.

In accordance with exemplary embodiments, an excess current is identified and the direction of the current is determined in the first measuring transducer 2. The phase rotation of the transformer and an additional correcting phase angle can be parameterized.

Thus, It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE NUMERALS

1 Medium Voltage Network, Medium Voltage Level
2 First Measuring Transducer
3 Low Voltage Network, Low Voltage Level
4 Transformer for Transforming the Medium Voltage into a Low Voltage
5 Processing Unit, Further-processing Unit
6 Second Measuring Transducer
7 Communication Unit

The invention claimed is:

1. A method for determining a direction of an excess current in an energy supply network having at least one local network station or transformer substation that connects a medium voltage level of a medium voltage network and a low voltage level of a low voltage network to one another by way of a transformer, the method comprising:
   measuring a current with a first measuring transducer in at least one output line of the medium voltage network and measuring a voltage in a low voltage level of the transformer or a subordinate low voltage distribution system to detect an excess current;
   measuring a phase difference between the current that is measured in the medium voltage level and the voltage that is measured in the low voltage level;
   evaluating the phase difference in the medium voltage network by the first measuring transducer or a processing unit that cooperates with the transducer, taking into account a phase rotation of the transformer; and
   determining a direction of an excess current from the phase difference.

2. The method as claimed in claim 1, further comprising:
   determining the direction of the excess current by setting a correcting phase angle, wherein the correcting phase angle takes into account a line phase angle, in the first measuring transducer or the processing unit.

3. The method as claimed in claim 2, further comprising:
measuring an additional current and voltage at the low voltage level of the transformer with a second measuring transducer, wherein a power flow through the transformer is determined from the measurement and thus a load-dependent voltage difference is determined from a magnitude of the power flow and the phase angle.

4. The method as claimed in claim 3, wherein the power flow through the transformer, and thus a load-dependent voltage difference, is determined with a transformer equivalent circuit diagram or transformer model that is implemented in the processing unit in order to use the phase angle to additionally correct the phase difference between current that is measured in the medium voltage level and voltage that is measured in the low voltage level.

5. The method as claimed in claim 4, wherein the first measuring transducer or the processing unit includes a storage device, the method comprising:
storing voltage values in the storage device until the excess current is detected, and the direction of the current is determined from the stored values.

6. The method as claimed in claim 5, further comprising:
measuring the current with current converters or current sensors.

7. The method as claimed in claim 1, further comprising:
measuring an additional current and an additional voltage at the low voltage level of the transformer with a second measuring transducer, wherein a power flow through the transformer is determined from the measurement and thus a load-dependent voltage difference is determined from a magnitude of the power flow and the phase angle.

8. The method as claimed in claim 7, wherein the power flow through the transformer, and thus a load-dependent voltage difference, is determined with a transformer equivalent circuit diagram or transformer model that is implemented in the processing unit in order to use the phase angle to additionally correct the phase difference between current that is measured in the medium voltage level and voltage that is measured in the low voltage level.

9. The method as claimed in claim 1, wherein the first measuring transducer or the processing unit includes a storage device, the method further comprising:
storing voltage values in the storage device until the excess current is detected, and the direction of the current is determined from the stored values.

10. The method as claimed in claim 1, further comprising:
measuring the current with current converters or current sensors.

11. An arrangement to determine a direction of excess current in an energy supply network having at least one local network station or transformer substation that connects a medium voltage level of a medium voltage network and a low voltage level of a low voltage network to one another by way of a transformer, the arrangement comprising:

a first measuring transducer to make a current measurement in at least one output line of a medium voltage level and to make a voltage measurement on a low voltage level of a transformer to detect an excess current; and a processing unit within, or that cooperates with, said measuring transducer and configured to determine from the current measurement and voltage measurement a phase difference between current that is measured in the medium voltage level and voltage that is measured in the low voltage level, the processing unit being configured to take into account a phase rotation of the transformer, to evaluate the phase difference and determine a direction of an excess current.

12. The arrangement as claimed in claim 11, further comprising:
a second measuring transducer that cooperates with the first measuring transducer to perform an additional current measurement and voltage measurement at the low voltage level of the transformer, wherein the processing unit is configured to determine a power flow through the transformer from this measurement, and thus a load-dependent voltage difference from a magnitude of the power flow and the phase angle.

13. The arrangement as claimed in claim 12, wherein the measuring transducers comprise:
current converters or current sensors to measure current.

14. The arrangement as claimed in claim 13, further comprising:
a communication unit, configured such that measured values and/or notifications regarding a direction of excess current that are provided by the measuring transducers, or by the processing unit, are transferred by the communication unit to a network control centre or a higher ranking control unit to isolate a point of fault in an energy supply network by remote diagnosis.

15. The arrangement as claimed in claim 14, wherein the communication unit is arranged in a separate device or in the processing unit.

16. The arrangement as claimed in claim 15, further comprising:
a display apparatus that displays data or notifications regarding a direction of current that is obtained from the measured values.

17. The arrangement as claimed in claim 16, wherein the energy supply network comprises decentralized energy systems.

18. The arrangement as claimed in claim 11, further comprising:
a communication unit, configured such that measured values and/or notifications regarding a direction of excess current that are provided by the measuring transducer, or by the processing unit, will be transferred by the communication unit to a network control centre or a higher ranking control unit to isolate a point of fault in an energy supply network by remote diagnosis.

* * * * *